US012520687B2

(12) United States Patent
Lee et al.

(10) Patent No.: US 12,520,687 B2
(45) Date of Patent: Jan. 6, 2026

(54) DISPLAY APPARATUS HAVING WIRING AREAS WITH WIRINGS OF DIFFERENT WIDTHS

(71) Applicant: SAMSUNG DISPLAY CO., LTD., Yongin-si (KR)

(72) Inventors: Sungeun Lee, Yongin-si (KR); Kyungho Kim, Yongin-si (KR); Younjoon Kim, Yongin-si (KR); Minjeong Oh, Yongin-si (KR); Kijune Lee, Yongin-si (KR); Jinho Ju, Yongin-si (KR); Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 409 days.

(21) Appl. No.: 18/109,420

(22) Filed: Feb. 14, 2023

(65) Prior Publication Data
US 2024/0040875 A1    Feb. 1, 2024

(30) Foreign Application Priority Data
Jul. 29, 2022 (KR) .................. 10-2022-0095046

(51) Int. Cl.
H10K 59/131    (2023.01)
H10K 77/10     (2023.01)
H10K 102/00    (2023.01)

(52) U.S. Cl.
CPC ........ H10K 59/1315 (2023.02); H10K 77/111 (2023.02); H10K 2102/311 (2023.02)

(58) Field of Classification Search
CPC ............ H10K 59/1315; H10K 77/111; H10K 2102/311
See application file for complete search history.

(56) References Cited

U.S. PATENT DOCUMENTS

| 9,881,982 | B2 | 1/2018 | Kang et al. | |
| 11,171,189 | B2 | 11/2021 | Oh et al. | |
| 11,256,377 | B2 | 2/2022 | Hwang et al. | |
| 2019/0148476 | A1* | 5/2019 | Park | H10K 59/8731 257/40 |
| 2021/0083037 | A1* | 3/2021 | Kim | G09G 3/3291 |
| 2024/0306457 | A1* | 9/2024 | Wu | H10K 59/1315 |
| 2025/0056984 | A1* | 2/2025 | Wang | H10H 29/142 |

FOREIGN PATENT DOCUMENTS

| KR | 20160092183 A | 8/2016 |
| KR | 1020160090979 A | 8/2016 |
| KR | 1020190030798 A | 3/2019 |
| KR | 1020210124608 A | 10/2021 |

* cited by examiner

Primary Examiner — Michael Jung
(74) Attorney, Agent, or Firm — CANTOR COLBURN LLP

(57) ABSTRACT

A display apparatus includes a substrate including a plurality of pixel circuit areas and a plurality of wiring areas, each of the wiring areas being arranged between corresponding adjacent pixel circuit areas of the plurality of pixel circuit areas, a pixel circuit arranged in each of the plurality of pixel circuit areas and including at least one thin film transistor, a plurality of wirings arranged in the pixel circuit areas and the wiring areas, and a display element connected to the pixel circuit. The first width of the wirings arranged in the wiring areas is greater than the second width of the wirings arranged in the pixel circuit areas.

19 Claims, 10 Drawing Sheets

DISPLAY APPARATUS HAVING WIRING AREAS WITH WIRINGS OF DIFFERENT WIDTHS

This application claims priority to Korean Patent Application No. 10-2022-0095046, filed on Jul. 29, 2022, and all the benefits accruing therefrom under 35 U.S.C. § 119, the content of which in its entirety is herein incorporated by reference.

BACKGROUND

1. Field

Embodiments relate to a display apparatus.

2. Description of the Related Art

Recently, uses of display panels are being diversified. Furthermore, it is a trend that a scope of a use thereof becomes wider as a thickness and a weight of a display panel decrease.

SUMMARY

As a size of a display area in a display panel increases, constituent elements are arranged in a relatively narrow outer area, and when cracks are generated according to an arrangement of constituent elements, the cracks may deteriorate the reliability of a display apparatus or reduce display quality.

Embodiments include a display apparatus having improved reliability and display quality.

Additional features will be set forth in part in the description which follows and, in part, will be apparent from the description, or may be learned by practice of the presented embodiments of the disclosure.

According to an embodiment of the disclosure, a display apparatus includes a substrate including a plurality of pixel circuit areas and a plurality of wiring areas, each of the plurality of wiring areas being arranged between corresponding adjacent pixel circuit areas of the plurality of pixel circuit areas, a pixel circuit arranged in each of the plurality of pixel circuit areas and including at least one thin film transistor, a plurality of wirings arranged in the plurality of pixel circuit areas and the plurality of wiring areas, and a display element connected to the pixel circuit. A first width of the plurality of wirings arranged in the plurality of wiring areas is greater than a second width of the plurality of wirings arranged in the plurality of pixel circuit areas.

In an embodiment, the first width may be 1.5 times or more greater than the second width.

In an embodiment, the substrate may further include a plurality of non-wiring areas, each of the plurality of non-wiring areas being arranged between corresponding adjacent wiring areas of the plurality of wiring areas, and the size of one of the plurality of non-wiring areas may be 10 percent (%) or more of the size of one of the plurality of pixel circuit areas.

In an embodiment, the size of a pixel electrode of the display element may be greater than the size of an area occupied by the pixel circuit.

In an embodiment, two pixel circuits may be provided in each of the plurality of pixel circuit areas.

In an embodiment, the display apparatus may further include an inorganic insulating layer in which a groove is defined between the plurality of wirings in a wiring area of the plurality of wiring areas.

In an embodiment, the plurality of wirings may include a first wiring extending in a first direction and a second wiring extending in a second direction crossing the first direction, the first wiring may be arranged in the same layer as a gate electrode of the at least one thin film transistor, and the second wiring may be arranged in a different layer from the first wiring.

In an embodiment, the second wiring may be arranged in the same layer as a semiconductor layer of the at least one thin film transistor.

In an embodiment, the second wiring may be arranged on an inter-insulating layer that covers the at least one thin film transistor.

In an embodiment, the display apparatus may further include a folding area and a non-folding area. The size of one of the plurality of pixel circuit areas may be identical in the folding area and the non-folding area.

In an embodiment of the disclosure, a display apparatus includes a substrate including a plurality of pixel circuit areas and a plurality of wiring areas, each of the plurality of wiring areas being arranged between corresponding adjacent pixel circuit areas of the plurality of pixel circuit areas, a pixel circuit arranged in the plurality of pixel circuit areas and including at least one thin film transistor, a plurality of wirings arranged in the plurality of pixel circuit areas and the plurality of wiring areas, a display element connected to the pixel circuit. Each of the plurality of wirings arranged in the plurality of wiring areas includes a plurality of branched wirings branched from the plurality of wirings arranged in a pixel circuit area of the plurality of pixel circuit areas.

In an embodiment, an opening corresponding to a wiring area of the plurality of wiring areas is defined in the plurality of wirings.

In an embodiment, the plurality of wirings may include a first wiring extending in a first direction and a second wiring extending in a second direction crossing the first direction, and the first wiring and the second wiring are arranged in different layers.

In an embodiment, a first opening corresponding to a wiring area of the plurality of wiring areas may be defined in the first wiring, and the first wiring may be branched into a first-1 branched wiring disposed above the first opening and a first-2 branched wiring disposed below the first opening.

In an embodiment, a second opening corresponding to a wiring area of the plurality of wiring areas may be defined in the second wiring, and the second wiring may be branched into a second-1 branched wiring disposed to left of the second opening and a second-2 branched wiring disposed to right of the second opening.

In an embodiment, the first wiring may include a scan line, and the second wiring includes a data line.

In an embodiment, the substrate may further include a plurality of non-wiring areas, each of the plurality of non-wiring areas being arranged between corresponding adjacent wiring areas of the plurality of wiring areas, and the size of one of the plurality of non-wiring areas may be 10% or more of the size of one of the plurality of pixel circuit areas.

In an embodiment, the size of a pixel electrode of the display element may be greater than the size of an area occupied by the pixel circuit.

In an embodiment, the display apparatus may further include an inorganic insulating layer in which a groove is defined between the plurality of wirings in a wiring area of the plurality of wiring areas.

In an embodiment, the display apparatus may further include a folding area and a non-folding area. The size of one of the plurality of pixel circuit areas may be identical in the folding area and the non-folding area.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
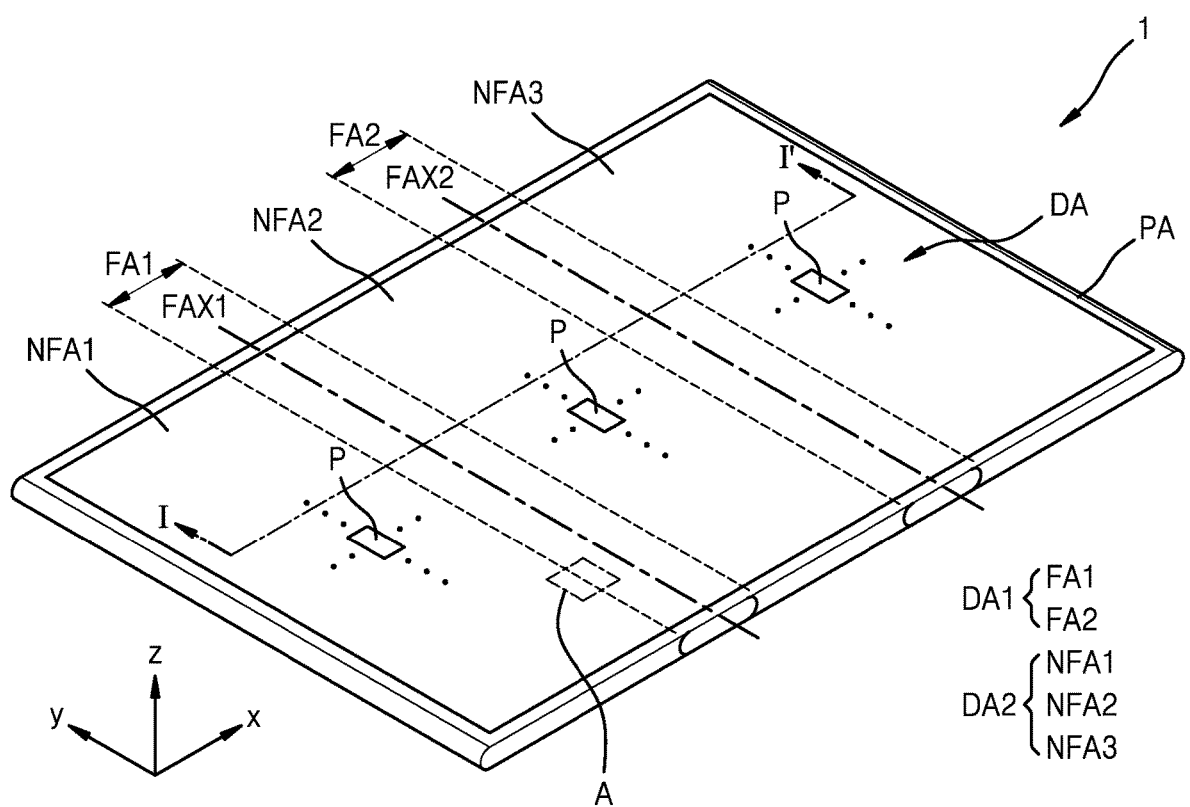
FIG. 1 is a schematic perspective view of an embodiment of a display apparatus.

Reference will now be made in detail to embodiments, examples of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the illustrated embodiments, and particular embodiments will be illustrated in the drawings and described in the detailed description section. The effect and features of the illustrated embodiments, and a method to achieve the same, will be clearer referring to the detailed descriptions below with the drawings. However, the illustrated embodiments may be implemented in various forms, not by being limited to the embodiments presented below.

Hereinafter, embodiments will be described in detail with reference to the accompanying drawings, and in the description with reference to the drawings, the same or corresponding constituents are indicated by the same reference numerals and redundant descriptions thereof are omitted.

In an embodiment below, terms such as "first" and "second" are used herein merely to describe a variety of constituent elements, but the constituent elements are not limited by the terms. Such terms are used only for the purpose of distinguishing one constituent element from another constituent element.

In an embodiment below, the expression of singularity in the specification includes the expression of plurality unless clearly specified otherwise in context.

In an embodiment below, it will be further understood that the terms "comprises" and/or "comprising" used herein specify the presence of stated features or components, but do not preclude the presence or addition of one or more other features or components In an embodiment below, it will be understood that when a component, such as a layer, a film, a region, or a plate, is referred to as being "on" another component, the component can be directly on the other component or intervening components may be present thereon.

Sizes of components in the drawings may be exaggerated for convenience of explanation. In other words, since sizes and thicknesses of components in the drawings are arbitrarily illustrated for convenience of explanation, the disclosure is not limited thereto.

In an embodiment below, the x-axis, the y-axis and the z-axis are not limited to three axes of the rectangular coordinate system, and may be interpreted in a broader sense. The x-axis, the y-axis, and the z-axis may be perpendicular to one another, or may represent different directions that are not perpendicular to one another, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

When an illustrative embodiment may be implemented differently, a specific process order may be performed differently from the described order. In an embodiment, two consecutively described processes may be performed substantially at the same time or performed in an order opposite to the described order.

Figure 2:
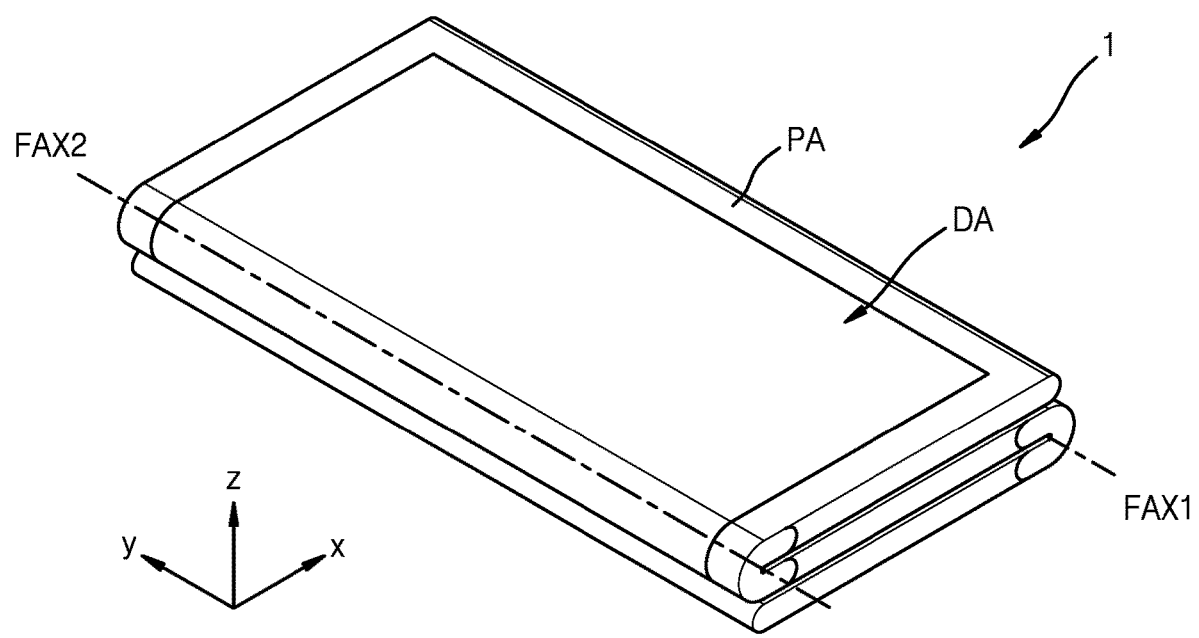
FIG. 2 is a schematic perspective view of an embodiment of a display apparatus in a folded state.

FIG. 1 is a schematic perspective view of an embodiment of a display apparatus 1. FIG. 2 is a schematic perspective view of the display apparatus 1 in an embodiment in a folded state. FIG. 1 is a perspective view of the display apparatus 1 in an unfold state, and FIG. 2 is a perspective view of the display apparatus 1 in a fold state.

The display apparatus 1 is an apparatus for displaying a video or a still image, and may be used as a display screen of various products including not only portable electronic devices, such as mobile phones, smart phones, tablet personal computers, mobile communication terminals, electronic organizers, electronic books, portable multimedia players ("PMPs"), navigation devices, ultra-mobile personal computers, or the like, but also televisions, notebook computers, monitors, billboards, Internet of things ("IoT"), or the like. Furthermore, the display apparatus 1 may be used in wearable devices, such as smart watches, watch phones, glasses-type displays, and head mounted displays ("HMDs"). Furthermore, the display apparatus 1 may be used as a display for an instrument panel of a vehicle, a center information display ("CID") arranged in a center fascia or dashboard of vehicle, a room mirror display replacing a side mirror of a vehicle, and a display arranged on the rear surface of the front seat as an entertainment for the rear seat of a vehicle.

The display apparatus 1 may be, as illustrated in FIG. 1, unfolded to be entirely flat. The display apparatus 1 may be, as illustrated in FIG. 2, folded or curved.

In an embodiment, the display apparatus 1 may be folded such that display surfaces face each other. In another embodiment, the display apparatus 1 may be folded such that a display surface face outside. The "display surface" is a surface in which an image is displayed, and the display surface may include a display area DA and a peripheral area PA, and an image may be provided to a use through the display area DA. The term "folded" may mean that a shape is not fixed and may be transformed from the original shape to another shape, and include being folded, curved, or rolled in the form of a roll, with respect to one or more predetermined lines, that is, a folding axis.

Referring to FIGS. 1 and 2, the display apparatus 1 may have the display area DA and the peripheral area PA arranged outside the display area DA. The display area DA may be an area where a plurality of pixels P is arranged and an image is displayed. The peripheral area PA may surround the display area DA, and may be a non-display area where the pixels P are not arranged.

The display area DA may include a first display area DA1 and a second display area DA2. The first display area DA1 may be a folding area that is flexible and foldable, and the folding area may include one or more folding areas. The second display area DA2 may be a non-folding area that is unfoldable. In an embodiment, although an area that is not folded is also referred to as a non-folding area, this is merely exemplary, and the term "non-folding" may include not only a case of being rigid and unfoldable, but also cases of being flexible but less than the folding area and being flexible but not folded. The display apparatus 1 may display an image in the first display area DA1 and the second display area DA2.

The first display area DA1 may include a first folding area FA1 and a second folding area FA2. The first folding area FA1 may be folded with respect to a first folding axis FAX1, and the second folding area FA2 may be folded with respect to a second folding axis FAX2. In an embodiment, the first folding area FA1 and the second folding area FA2 may each have a similar size. In another embodiment, the first folding area FA1 and the second folding area FA2 may have different sizes from each other.

The second display area DA2 may include a first non-folding area NFA1, a second non-folding area NFA2, and a third non-folding area NFA3. The first folding area FA1 may be provided between the first non-folding area NFA1 and the second non-folding area NFA2, and the second folding area FA2 may be provided between the second non-folding area NFA2 and the third non-folding area NFA3.

Various electronic devices, printed circuit boards, or the like may be electrically attached on the peripheral area PA, and a voltage line for supplying power to drive a display element, or the like may be disposed therein. In an embodiment, a scan driver for supplying a scan signal to each pixel P, a data driver for supplying a data signal to each pixel P, lines (a clock signal line, a carry signal line, a drive voltage line, or the like) for supplying signals input to the scan driver and the data driver, a main power line, or the like may be arranged in the peripheral area PA, for example.

Figure 3A:
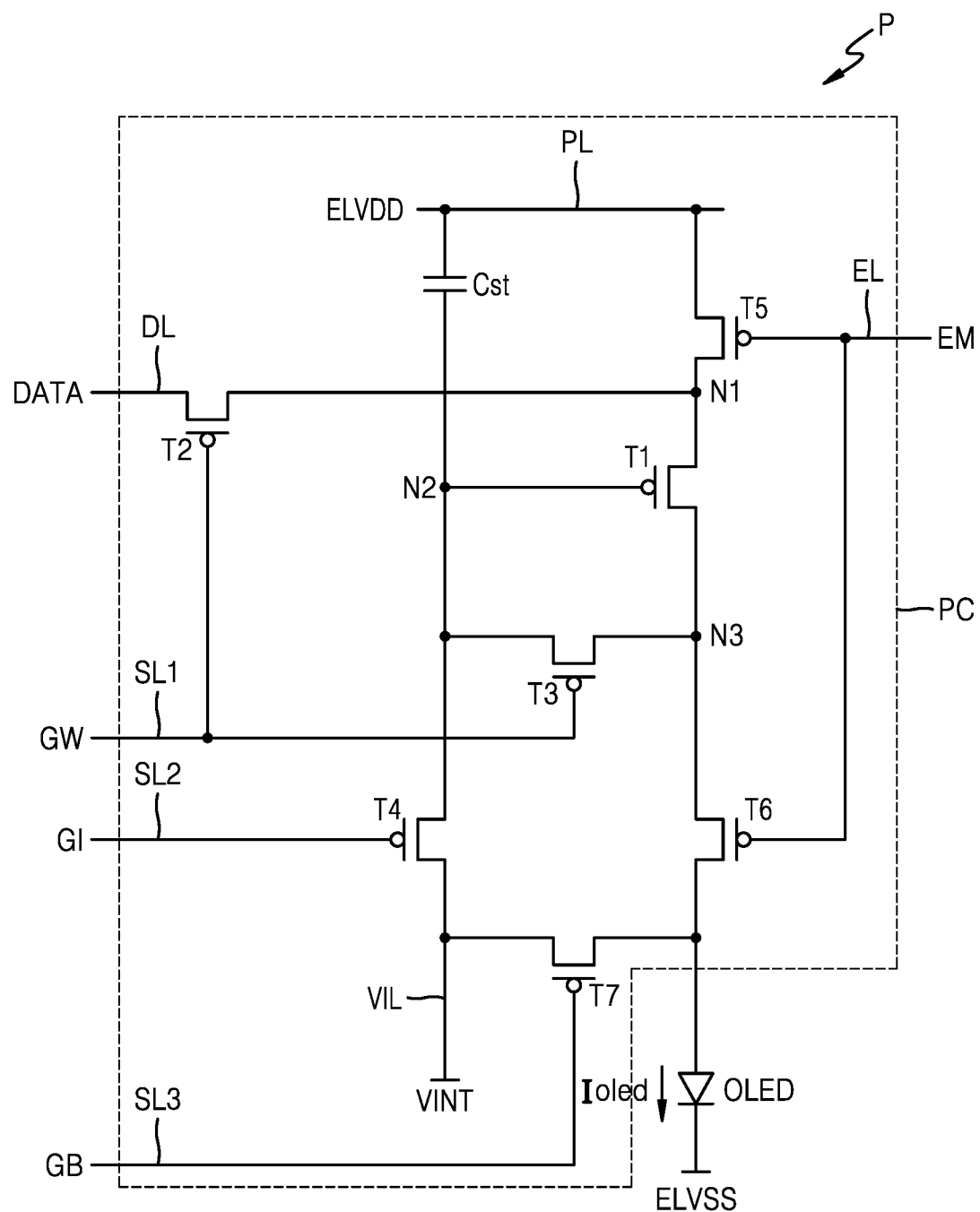
FIG. 3A is a schematic equivalent circuit diagram of an embodiment of any one pixel circuit.
Figure 3B:
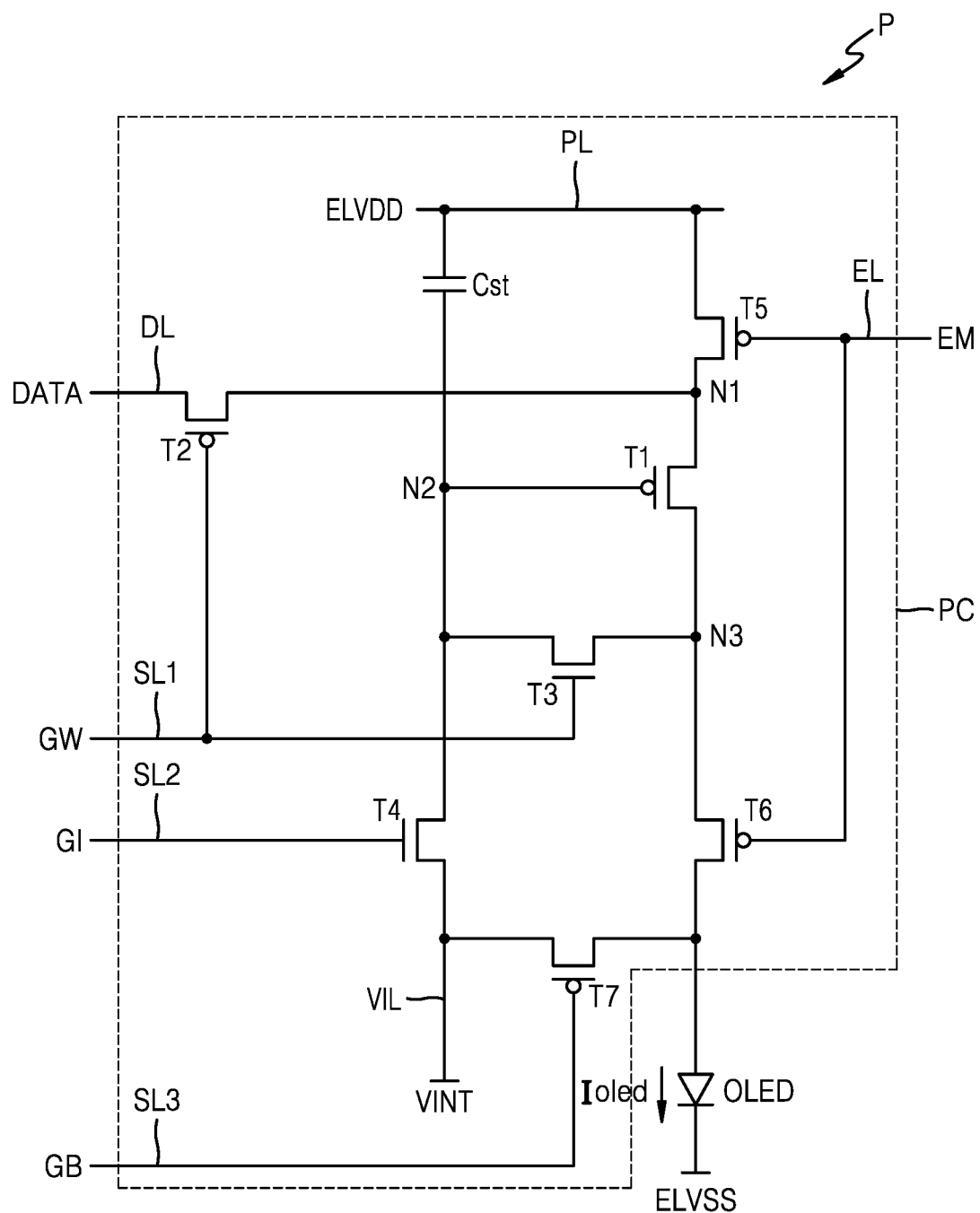
FIG. 3B is a schematic equivalent circuit diagram of an embodiment of any one pixel circuit.

FIGS. 3A and 3B are schematic equivalent circuit diagrams of any one pixel circuit arranged in a display panel. A pixel circuit PC of the pixel P in FIGS. 3A and 3B may include a first pixel circuit PC1 of a first pixel P1, a second pixel circuit PC2 of a second pixel P2, and a third pixel circuit PC3 of a third pixel P3. For convenience of explanation, the first pixel circuit PC1 of the first pixel P1, the second pixel circuit PC2 of the second pixel P2, and the third pixel circuit PC3 of the third pixel P3 may be also referred to as the pixel circuit PC.

Referring to FIG. 3A, the pixel circuit PC may include first to seventh transistors T1 to T7. Depending on the type (N-type or P-type) and/or operation conditions of a transistor, a first terminal of the transistor may be a source electrode or a drain electrode, and a second terminal thereof may be an electrode different from the first terminal. In an embodiment, when the first terminal is a source electrode, the second terminal may be a drain electrode, for example.

The pixel circuit PC may be connected to a first scan line SL for transmitting a first scan signal GW, a second scan line SL2 for transmitting a second scan signal GI, a third scan line SL3 for transmitting a third scan signal GB, a light-emitting control line EL for transmitting a light-emitting control signal EM, a data line DL for transmitting a data signal DATA, a drive voltage line PL for transmitting a drive voltage ELVDD, and an initialization voltage line VIL for transmitting an initialization voltage VINT. The pixel circuit PC may be, as a display element, connected to an organic light-emitting diode OLED.

A first transistor T1 may be connected between the drive voltage line PL and the organic light-emitting diode OLED. The first transistor T1 may be connected between a first node N1 and a third node N3. The first transistor T1 may be connected to the drive voltage line PL via the fifth transistor T5, and may be electrically connected to the organic light-emitting diode OLED via the sixth transistor T6. The first transistor T1 may include a gate electrode connected to a second node N2, a first terminal connected to the first node N1, and a second terminal connected to the third node N3. The drive voltage line PL may transmit the drive voltage ELVDD to the first transistor T1. The first transistor T1 serves as a drive transistor, and may receive the data signal DATA according to a switching operation of the second transistor T2 and supply a drive current $I_{oled}$ to the organic light-emitting diode OLED.

The second transistor T2 (data write transistor) may be connected between the data line DL and the first node N1. The second transistor T2 may be connected to the drive voltage line PL via the fifth transistor T5. The second transistor T2 may include a gate electrode connected to the first scan line SL1, a first terminal connected to the data line DL, and a second terminal connected to the first node N1. The second transistor T2 is turned on in response to the first scan signal GW received via the first scan line SL1 and may perform a switching operation of transmitting the data signal DATA received via the data line DL to the first node N1.

The third transistor T3 (compensation transistor) may be connected between the second node N2 and the third node N3. The third transistor T3 may be connected to the organic light-emitting diode OLED via the sixth transistor T6. The third transistor T3 may include a gate electrode connected to the first scan line SL1, a first terminal connected to the second node N2, and a second terminal connected to the third node N3. The third transistor T3 is turned on in response to the first scan signal GW received via the first scan line SL1 to diode-connect the first transistor T1, thereby compensating for a threshold voltage of the first transistor T1.

The fourth transistor T4 (first initialization transistor) may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 is turned on in response to the second scan signal GI received via the second scan line SL2 to transmit the initialization voltage VINT to the gate electrode of the first transistor T1, thereby initializing the gate electrode of the first transistor T1.

The fifth transistor T5 (first light-emitting control transistor) may be connected between the drive voltage line PL and the first node N1. The sixth transistor T6 (second light-emitting control transistor) may be connected between the third node N3 and the organic light-emitting diode OLED. The fifth transistor T5 may include a gate electrode connected to the light-emitting control line EL, a first terminal connected to the drive voltage line PL, and a second terminal connected to the first node N1. The sixth transistor T6 may include a gate electrode connected to the light-emitting control line EL, a first terminal connected to the third node N3, and a second terminal connected to a pixel electrode of the organic light-emitting diode OLED. As the fifth transistor T5 and the sixth transistor T6 are simultaneously turned on in response to the light-emitting control signal EM received via the light-emitting control line EL, a drive current flows in the organic light-emitting diode OLED.

The seventh transistor T7 (second initialization transistor) may be connected between the organic light-emitting diode OLED and the initialization voltage line VIL. The seventh transistor T7 may include a gate electrode connected to the third scan line SL3, a first terminal connected to the second terminal of the sixth transistor T6 and the pixel electrode of the organic light-emitting diode OLED, and a second terminal connected to the initialization voltage line VIL. The seventh transistor T7 is turned on in response to the third scan signal GB received via the third scan line SL3 to transmit the initialization voltage VINT to the pixel electrode of the organic light-emitting diode OLED, thereby initializing the pixel electrode of the organic light-emitting diode OLED.

A capacitor Cst may include a first electrode connected to the gate electrode of the first transistor T1 and a second electrode connected to the drive voltage line PL. The capacitor Cst may maintain a voltage to be applied to the gate electrode of the first transistor T1 by storing and maintaining a voltage corresponding to a voltage difference between the drive voltage line PL and the gate electrode of the first transistor T1.

The organic light-emitting diode OLED may include a pixel electrode (first electrode, anode) and a counter electrode (second electrode, cathode), and the counter electrode may receive a common voltage ELVSS. The organic light-emitting diode OLED receives the drive current from the first transistor T1 and emit light to display an image.

FIG. 3A illustrates that the first to seventh transistors T1 to T7 are P-type transistors. However, the disclosure is not limited thereto. In an embodiment, the first to seventh transistors T1 to T7 may be N-type transistors, or while some of the first to seventh transistors T1 to T7 may be N-type transistors, the other transistors may be P-type transistors, for example. FIG. 3B illustrates that, among the first to seventh transistors T1 to T7, the third transistor T3 and the fourth transistor T4 are N-type transistors, and the other transistors are P-type transistors. The third transistor T3 and the fourth transistor T4 may each include a semiconductor layer including an oxide, and the other transistors may include a semiconductor layer including silicon.

Although, in the illustrated embodiment, the organic light-emitting diode OLED is employed as a display element, in another embodiment, an inorganic light-emitting diode or a quantum-dot light-emitting diode may be employed as a display element.

Figure 4:
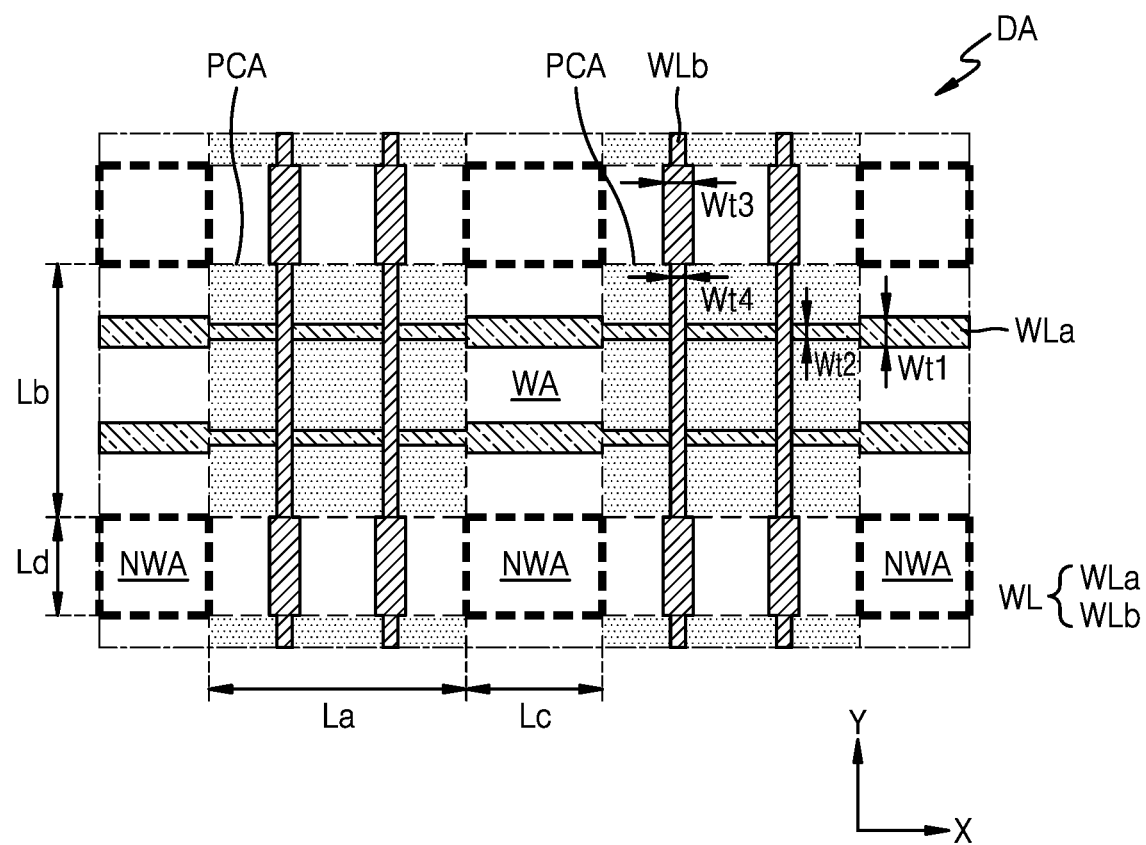
FIG. 4 is a schematic plan view of an embodiment of a pixel circuit area and a wiring area arranged in a display area of a display apparatus.
Figure 5:
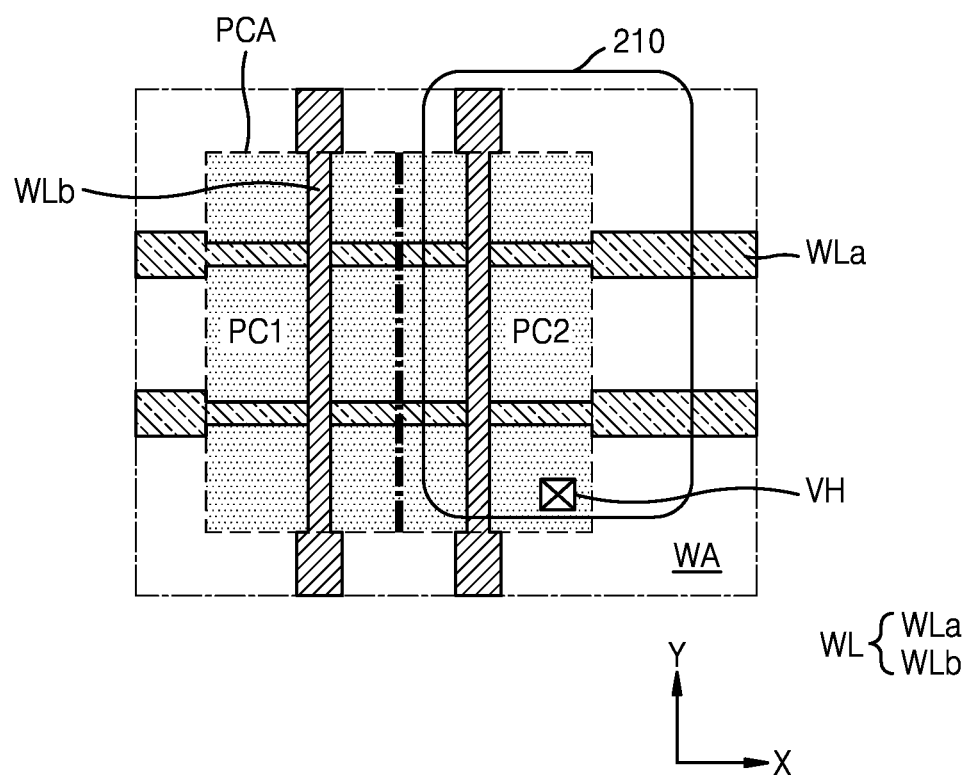
FIG. 5 is a schematic plan view showing an embodiment of the arrangement of a pixel electrode connected to a pixel circuit.

FIG. 4 is a schematic plan view of an embodiment of a pixel circuit area and a wiring area arranged in a display area of the display apparatus 1. FIG. 5 is a schematic plan view showing an arrangement of a pixel electrode connected to a pixel circuit.

Referring to FIG. 4, a plurality of pixel circuit areas PCA and a wiring area WA in which the pixel circuit areas PCA are arranged spaced apart from each other by a predetermined interval may be provided in the display area DA. The display area DA may be the folding area (FA1 and FA2; see FIG. 1) or the non-folding area (NFA1, NFA2, and NFA3; see FIG. 1).

In an embodiment, the pixel circuit areas PCA having the same structure and the wiring area WA by which the pixel circuit areas PCA are spaced apart from each other by a predetermined interval may be provided in the folding area and the non-folding area of the display apparatus 1.

When the sizes or arrangement structures of the pixel circuits in the folding area and the non-folding area are different from each other, parasitic capacitance or a resistance value of a conductive layer may become irregular, and thus, line staining may be generated in the display apparatus 1. Accordingly, as the pixel circuits and arrangement structures of the folding area and the non-folding area employ the same structure, the display apparatus 1 may have generally uniform characteristics.

The pixel circuit areas PCA may be repeatedly arranged in an X direction and a Y direction. Each of the pixel circuit areas PCA may be an area where a pixel circuit for driving a display element and wirings connected to the pixel circuit are arranged. At least one thin film transistor may be arranged in each of the pixel circuit areas PCA.

The wiring area WA, which is an area between the pixel circuit areas PCA, may be an area where the wirings connected to the pixel circuit are extended and arranged. The wiring area WA, in which a plurality of wirings is arranged, may not be an area where components, such as a thin film transistor or a capacitor, constituting the pixel circuit are not arranged.

The wiring area WA may be arranged in the upper, lower, left, and right sides with respect to each of the pixel circuit areas PCA. First wirings WLa extending in the X direction are arranged in the left wiring area and the right wiring area, and second wirings WLb extending in the Y direction may be arranged in the upper wiring area and the lower wiring area. A non-wiring area NWA may be arranged between the wiring areas WA. The non-wiring area NWA may be an area where wirings or transistors are not arranged. The non-wiring area NWA may include a plurality of non-wiring areas, and the non-wiring areas NWA are repeatedly arranged spaced apart from each other in the X direction and the Y direction.

When the display apparatus 1 includes the folding area, it is highly likely that external impacts are delivered to the pixel circuit when the display apparatus 1 is folded or unfolded, and thus, damage due to the external impacts may be prevented by reducing the area occupied by the pixel circuit. Accordingly, in embodiments, instead of reducing the size of each of the pixel circuit areas PCA occupied by the pixel circuit, damage due to the external impact may be prevented by increasing the wiring area WA that is a space between the pixel circuit areas PCA.

Each of the pixel circuit areas PCA may have a quadrangular (e.g., rectangular) shape with a first side having a first length La in the X direction and a second side having a second length Lb in the Y direction. In this state, the first length La may be different from the second length Lb. In some embodiments, the first length La and the second length Lb may each have a value of about 45 micrometers (μm) to about 65 μm.

The non-wiring area NWA may have a quadrangular (e.g., rectangular) shape with a first side having a third length Lc in the X direction and a second side having a fourth length Ld in the Y direction. In this state, the third length Lc may be different from the fourth length Ld. In some embodiments, the third length Lc and the fourth length Ld may have a value of about 10 μm to about 30 μm.

The third length Lc may be a length in which the pixel circuit areas PCA adjacent in the X direction are spaced apart from each other in the X direction. The fourth length Ld may be a length in which the pixel circuit areas PCA adjacent in the Y direction are spaced apart from each other in the Y direction.

In some embodiments, the third length Lc may have a range of about 30% to about 50% of the first length La. In some embodiments, the fourth length Ld may have a range of about 30% to about 50% of the third length Lc.

In an embodiment, the size of an area occupied by one non-wiring area NWA may be 10% or more of the size of an area occupied by one of the pixel circuit areas PCA. In an embodiment, the size of the area occupied by one non-wiring area NWA may satisfy the range within 10% to 25% of the size of the area occupied by one of the pixel circuit areas PCA, for example.

A plurality of wirings may be arranged in the display area DA, and the wirings may be arranged in each of the pixel circuit areas PCA and the wiring area WA. The wirings may include a first wiring WLa extending in the X direction and in a second wiring WLb extending in the Y direction. The first wiring WLa may include a scan line for transmitting a scan signal, a light-emitting control line for transmitting a light-emitting control signal, or an initialization voltage line for transmitting an initialization voltage. The second wiring WLb may include a data line for transmitting a data signal and a drive voltage line for transmitting a drive voltage. The first wiring WLa and the second wiring WLb may be arranged in different layers. The width of the first wiring WLa may be different from the width of the second wiring WLb.

In the illustrated embodiment, a first width Wt1 of the first wiring WLa arranged in the wiring area WA may be greater than a second width Wt2 of the first wiring WLa arranged in the pixel circuit areas PCA. The first width Wt1 may be 1.5 times or more greater than the second width Wt2. In some embodiments, the first width Wt1 may be 1.5 times to 3 times greater than the second width Wt2.

Likewise, a third width Wt3 of the second wiring WLb arranged in the wiring area WA may be greater than a fourth width Wt4 of the second wiring WLb arranged in the pixel circuit areas PCA. The third width Wt3 may be 1.5 times or more greater than the fourth width Wt4. In some embodiments, the third width Wt3 may be 1.5 times to 3 times greater than the fourth width Wt4.

As a wiring WL including the first wiring WLa and the second wiring WLb arranged in the wiring area WA is provided with a relatively large width, electrical resistance of the wiring WL may be reduced, and a risk that the wiring WL is short-circuited due to external impacts may be remarkably reduced.

Referring to FIG. 5, the first pixel circuit PC1 and the second pixel circuit PC2 may be continuously arranged in one of the pixel circuit areas PCA. The first pixel circuit PC1 and the second pixel circuit PC2 may have the same structure. Unlike the above, the first pixel circuit PC1 may be symmetrical to the second pixel circuit PC2 with respect to a virtual line. The first pixel circuit PC1 and the second pixel circuit PC2 may each be connected to a pixel electrode of a separate display element. FIG. 5 illustrates only a pixel electrode 210 connected to the second pixel circuit PC2. The pixel electrode 210 may be connected to the second pixel circuit PC2 via a via hole VH. In some embodiments, a connection electrode to connect the pixel electrode 210 to the second pixel circuit PC2, or the like, may be further provided.

In the illustrated embodiment, the size of an area occupied by the pixel electrode 210 may be greater than the size of an area occupied by the second pixel circuit PC2 to which the pixel electrode 210 is connected. The pixel electrode 210 may be arranged to partially overlap the second pixel circuit PC2 and the wiring area WA.

Figure 6:
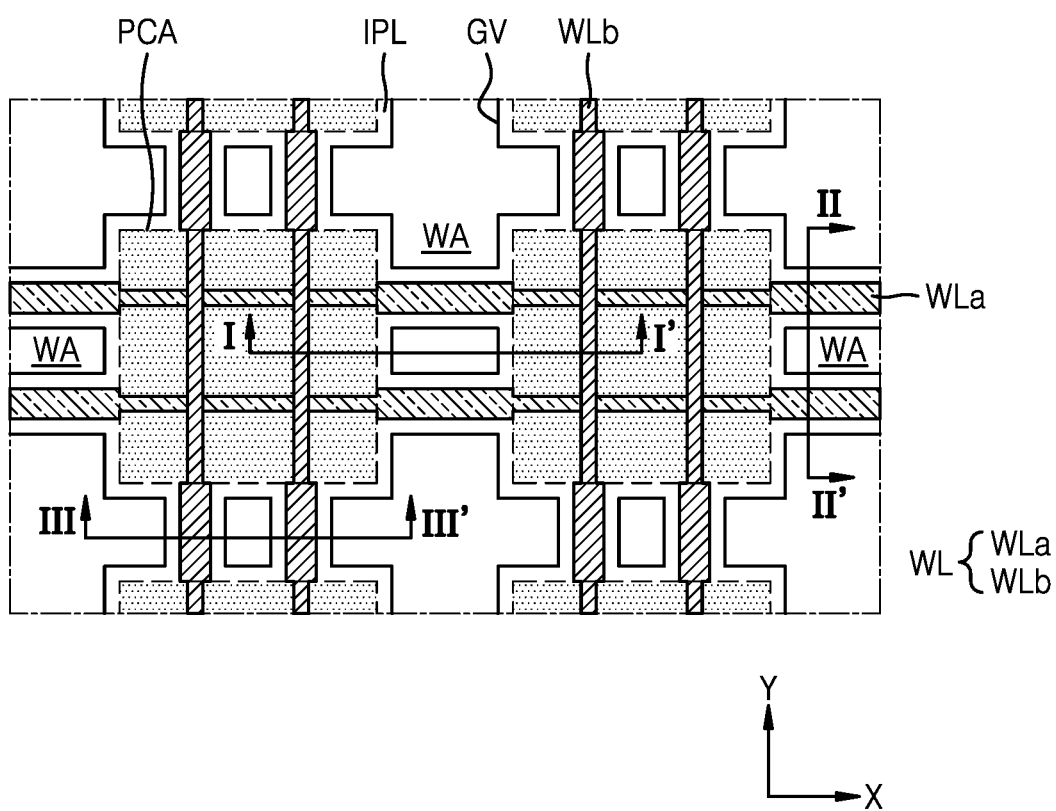
FIG. 6 is a schematic plan view of an embodiment of a pixel circuit area and a wiring area arranged in a display area of a display apparatus.
Figure 7:
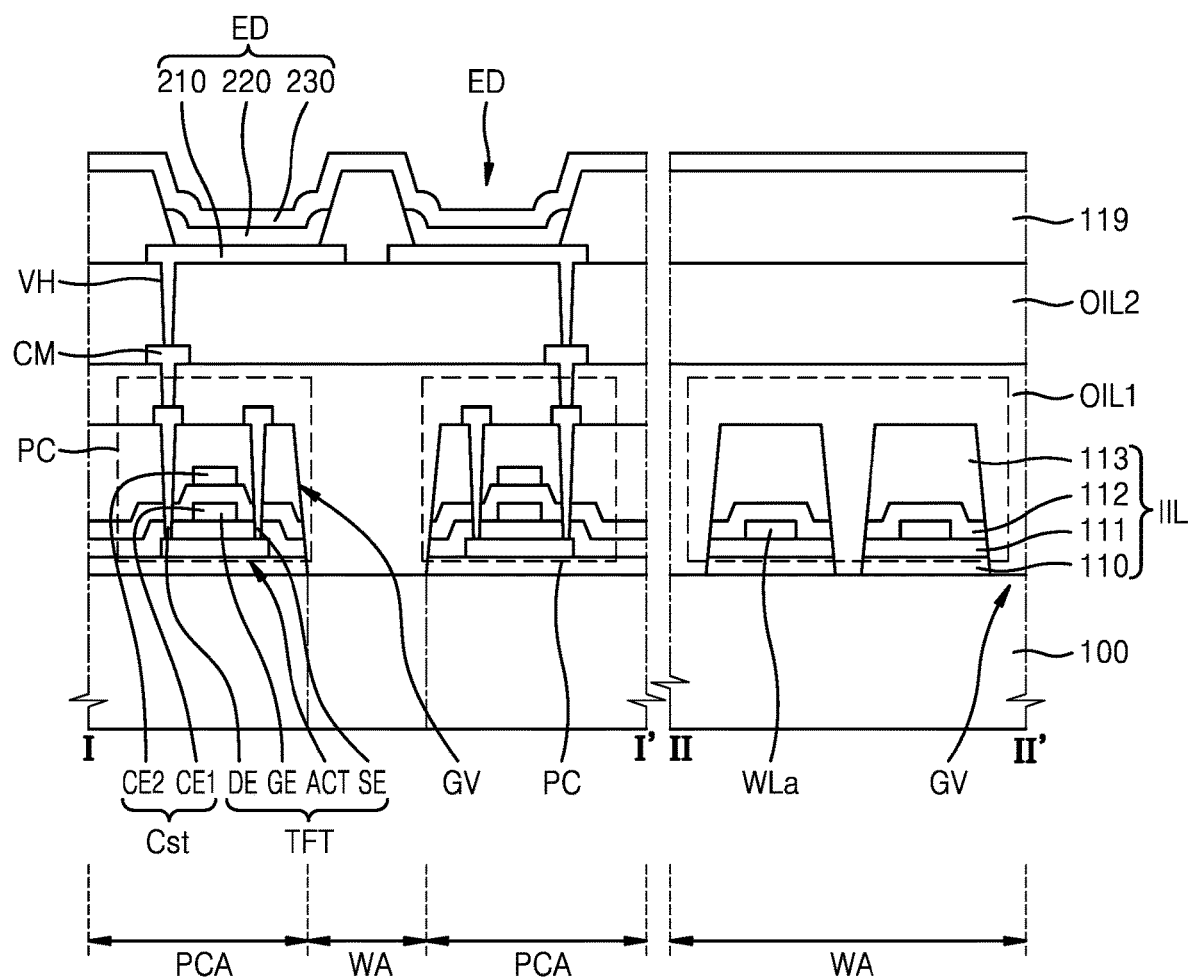
FIG. 7 is a cross-sectional view taken along lines I-I' and II-II' of FIG. 6, showing the arrangement of an organic light-emitting diode.
Figure 8:
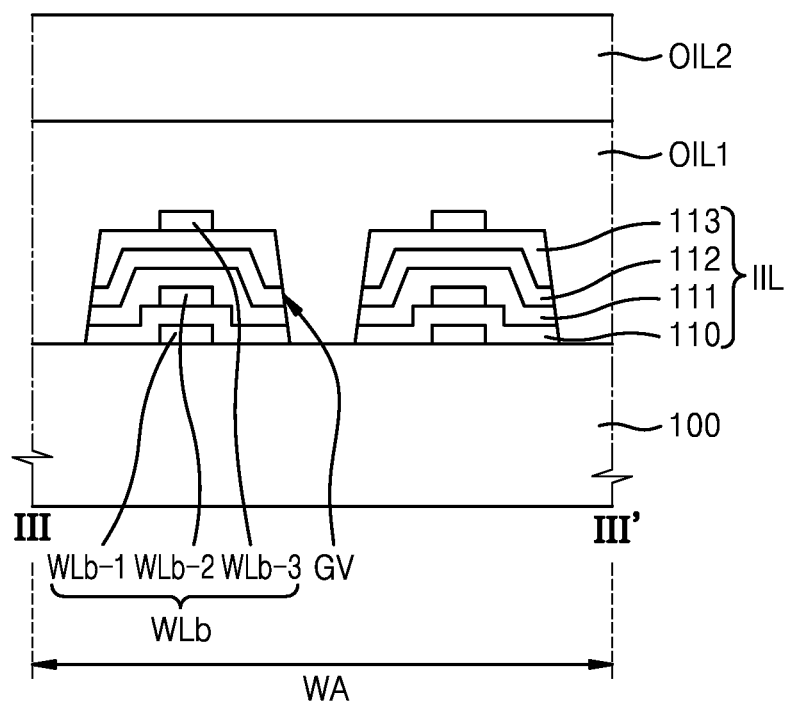
FIG. 8 is a cross-sectional view taken along line III-III' of FIG. 6.

FIG. 6 is a schematic plan view of an embodiment of a pixel circuit area and a wiring area arranged in a display area of the display apparatus 1. In FIGS. 4 and 6, like reference numerals denote like elements. FIG. 7 is a cross-sectional view showing an arrangement of an organic light-emitting diode taken along lines I-I' and II-II' of FIG. 6. FIG. 8 is a cross-sectional view of the display apparatus taken along line III-III' of FIG. 6.

Referring to FIG. 6, the display apparatus 1 may include an inorganic insulating layer in which a groove GV arranged in the wiring area WA is defined. The inorganic insulating layer may include, as the groove GV is defined, an inorganic insulation pattern IPL formed along edges of the pixel circuit areas PCA and the wiring WL. The groove GV may be defined in the wiring area WA between the pixel circuit areas PCA. In detail, the groove GV may be defined in an area between the wirings WL in the wiring area WA and the non-wiring area NWA.

Referring to FIG. 7, the pixel circuit PC disposed on a substrate 100 may include a thin film transistor TFT and the capacitor Cst, and may be connected to wrings, such as the scan line, the data line, or the like.

The substrate 100 may include or consist of various materials, such as a metal material, a plastic material, or the like. In an embodiment, the substrate 100 may be a flexible substrate. The substrate 100 may include polymer resin, such as polyethersulfone ("PES"), polyarylate ("PAR"), polyetherimide ("PEI"), polyethylene naphthalate ("PEN"), polyethylene terephthalate ("PET"), polyphenylene sulfide ("PPS"), polyimide ("PI"), polycarbonate, cellulose triacetate ("TAC"), cellulose acetate propionate ("CAP"), or the like. In an embodiment, the substrate 100 may be a multilayer structure including a base layer including the above-described polymer resin and a barrier layer. The barrier layer may include an inorganic material, such as a silicon nitride ($SiN_x$) and/or a silicon oxide ($SiO_2$).

A buffer layer 110 may be disposed on the substrate 100. The buffer layer 110 may include an inorganic insulating material, such as $SiN_x$, a silicon oxynitride (SiON) and/or $SiO_2$, and may be a single layer or multilayer including the above-described inorganic insulating material.

A semiconductor layer ACT may be disposed on the buffer layer 110. The semiconductor layer ACT may include an amorphous silicon, a polycrystalline silicon, an oxide, or an organic semiconductor material. The semiconductor layer ACT may include a channel region, a source region, and a drain region.

A first insulating layer 111 may be provided to cover the semiconductor layer ACT. The first insulating layer 111 may include an inorganic insulating material, such as $SiO_2$, a silicon nitride ($SiN_x$), a silicon oxynitride ($SiO_xN_y$), an aluminum oxide ($Al_2O_3$), a titanium oxide ($TiO_2$), or the like. The first insulating layer 111 may be a single layer or multilayer including the above-described inorganic insulating material.

A gate electrode GE may be disposed on the first insulating layer 111 to overlap the semiconductor layer ACT. Furthermore, at least one first wiring WLa may be further disposed on the first insulating layer 111. In an embodiment, the first wiring WLa may be a scan line or a light-emitting control line. The gate electrode GE and the first wiring WLa may each include molybdenum (Mo), aluminum (Al), copper (Cu), titanium (Ti), or the like, and may each be a single layer or multilayer.

A second insulating layer 112 may cover the gate electrode GE. The second insulating layer 112 may include an inorganic insulating material, such as $SiO_2$, $SiN_x$, $SiO_xN_y$, $Al_2O_3$, a titanium oxide ($TiO_2$), or the like. The second insulating layer 112 may be a single layer or multilayer including the above-described inorganic insulating material.

The capacitor Cst may be arranged on the gate electrode GE to overlap the same. The capacitor Cst may include a lower electrode CE1 and an upper electrode CE2. The second insulating layer 112 may be arranged between the lower electrode CE1 and the upper electrode CE2. The gate electrode GE may function not only as a gate electrode of the thin film transistor TFT, but also as the lower electrode CE1 of the capacitor Cst. In other words, the gate electrode GE and the lower electrode CE1 may form one body. The upper electrode CE2 may be disposed on the second insulating layer 112 to at least partially overlap the lower electrode CE1.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer including the above-described material.

A third insulating layer 113 may cover the upper electrode CE2. The third insulating layer 113 may include $SiO_2$, $SiN_x$, $SiO_xN_y$, $Al_2O_3$, a titanium oxide ($TiO_2$), or the like. The third insulating layer 113 may be a single layer or multilayer including the above-described inorganic insulating material.

When the buffer layer 110, the first insulating layer 111, the second insulating layer 112, and the third insulating layer 113 are collectively referred to as an inorganic insulating layer IIL, the groove GV or an opening may be defined in the inorganic insulating layer IIL. The groove GV may have a shape obtained by removing a portion of the inorganic insulating layer IIL. In an embodiment, the groove GV of the inorganic insulating layer IIL may be arranged in the wiring area WA, and the groove GV may be defined in the wiring area WA between the first wirings WLa. In an alternative embodiment, the groove GV may be defined between the pixel circuit areas PCA adjacent to each other.

The groove GV may be defined by overlapping an opening of the buffer layer 110, an opening of the first insulating layer 111, an opening of the second insulating layer 112, and an opening of the third insulating layer 113. The opening of the buffer layer 110, the opening of the first insulating layer 111, the opening of the second insulating layer 112, and the opening of the third insulating layer 113 may be respectively defined in separate processes, or simultaneously defined in the same process. When the opening of the buffer layer 110, the opening of the first insulating layer 111, the opening of the second insulating layer 112, and the opening of the third insulating layer 113 are respectively defined in separate processes, the groove GV may have a step shape.

Contact holes, through which a conductive layer formed subsequent to the third insulating layer 113 contacts a lower conductive layer, e.g., a semiconductor layer, a gate electrode, a capacitor upper electrode, a scan line, or the like, may be defined in at least one of the first insulating layer 111, the second insulating layer 112, and the third insulating layer 113. The contact holes may be defined simultaneously with defining the groove GV.

A source electrode SE and a drain electrode DE may be disposed on the third insulating layer 113. The source electrode SE and the drain electrode DE may be respectively connected to the source region and the drain region of the semiconductor layer ACT via contact holes. The source electrode SE and the drain electrode DE may include a conductive material including Mo, Al, Cu, Ti, or the like, and may be formed in a multilayer or single layer including the material. In an embodiment, the source electrode SE and the drain electrode DE may each be a triple layer structure of titanium, aluminum, and titanium (Ti/Al/Ti) that are sequentially arranged.

A first organic insulating layer OIL1 may cover the source electrode SE and the drain electrode DE. The first organic insulating layer OIL1 may be formed on the entirety of the surface of the substrate 100 while filling the groove GV. As the first organic insulating layer OIL1 is disposed inside the groove GV, stress or cracks according to the folding of the display apparatus 1 may be prevented from being introduced into another pixel area.

A connection electrode CM and/or a signal line (not shown) may be disposed on the first organic insulating layer OIL1. The connection electrode CM maybe connected to the source electrode SE or the drain electrode DE via a contact hole of the first organic insulating layer OIL1. The connection electrode CM may include a conductive material including Mo, Al, Cu, Ti, or the like, and may be formed in a multilayer or single layer including the material. A second organic insulating layer OIL2 may cover the connection electrode CM.

The first organic insulating layer OIL1 and the second organic insulating layer OIL2 may each include an organic insulating material, such as general-purpose polymers, polymer derivatives having a phenolic group, acrylic polymers, imide-based polymers, aryl ether-based polymers, amide-based polymers, fluorine-based polymers, p-xylene-based polymers, vinyl alcohol-based polymers, and blends thereof.

Display elements ED may be disposed on the second organic insulating layer OIL2. The display elements ED may include the pixel electrode 210, a light-emitting layer 220, and a counter electrode 230.

The pixel electrode 210 may be disposed on the second organic insulating layer OIL2. The pixel electrode 210 may be connected to the connection electrode CM via the via hole VH that passes through the second organic insulating layer OIL2, so as to be connected to the pixel circuit PC. The pixel electrode 210 may be arranged in at least part of each of the pixel circuit areas PCA and the wiring area WA.

The pixel electrode 210 may be a (semi-)transmissive electrode or a reflective electrode. In an embodiment, the pixel electrode 210 may include a reflective layer including Ag, Mg, Al, Pt, Pd, Au, Ni, Nd, Ir, Cr, any combinations thereof, or the like, for example, and a transparent or semi-transparent electrode layer disposed on the reflective layer. The transparent or semi-transparent electrode layer may include at least one selected from the group including an indium tin oxide ("ITO"), an indium zinc oxide ("IZO"), a zinc oxide (ZnO), an indium oxide ($In_2O_3$), an indium gallium oxide ("IGO"), and an aluminum zinc oxide ("AZO"). In an embodiment, the pixel electrode 210 may have three-layer structure of ITO/Ag/ITO, for example.

A pixel defining layer 119 may be disposed on the second organic insulating layer OIL2. The pixel defining layer 119 may cover the edge of the pixel electrode 210, and may define a pixel by defining an opening to expose a part of the pixel electrode 210. In other words, the size and shape of a light-emitting area may be defined by an opening of the pixel defining layer 119. The opening of the pixel defining layer 119 may correspond to an exposed area of the pixel electrode 210. The pixel defining layer 119 may include or consist of an organic insulating material, such as polyimide, polyamide, acryl resin, benzocyclobutene, hexamethyldisiloxane ("HMDSO"), phenol resin, or the like, and formed by a method, such as spin coating or the like. In some embodiments, the pixel defining layer 119 may include an insulating material, e.g., an organic insulating material, including a pigment or dye having a black color, thereby improving visibility by preventing mixing between adjacent pixels.

The light-emitting layer 220 may include a substantially low molecular weight or polymer material, and emit red, green, blue, or white light. A first common layer (not shown) and/or a second common layer (not shown) may be respectively disposed below and above the light-emitting layer 220. The first common layer is a constituent element disposed below the light-emitting layer 220 and may include, e.g., a hole transport layer ("HTL"), or an HTL and a hole injection layer ("HIL"). The second common layer is a constituent element disposed above the light-emitting layer 220 may include an electron transport layer ("ETL") and/or an electron injection layer ("EIL"). In some embodiments, the second common layer may not be provided.

While the light-emitting layer 220 is arranged for each pixel to correspond to the opening of the pixel defining layer 119, the first common layer and the second common layer may each be a common layer that is unitary to cover an entirety of the display area DA of the substrate 100, like the counter electrode 230 that is described below.

The counter electrode 230 may be disposed on the light-emitting layer 220. The counter electrode 230 may include a conductive material having a substantially low work function. In an embodiment, the counter electrode 230 may include a (semi-)transparent layer including Ag, Mg, Al, Pt, lithium (Li), Ca, any alloys thereof, or the like, for example. In an alternative embodiment, the counter electrode 230 may further include a layer such as ITO, IZO, ZnO, or $In_2O_3$ on the (semi-)transparent layer including the above-described material. The counter electrode 230 may be unitary with a plurality of display elements to correspond to the pixel electrodes 210.

Referring to FIG. 8, the groove GV may be defined in the wiring area WA between the second wirings WLb disposed in the same layer. The first organic insulating layer OIL1 is arranged in the groove GV to thus prevent introduction of cracks.

The second wiring WLb may include a second-1 wiring WLb-1, a second-2 wiring WLb-2, and/or a second-3 wiring WLb-3, which are disposed in different layers. The second-1 wiring WLb-1, the second-2 wiring WLb-2, and/or the second-3 wiring WLb-3 may at least partially overlap one another.

The second-1 wiring WLb-1 may be disposed between the substrate 100 and the buffer layer 110. The second-2 wiring WLb-2 may be disposed between the buffer layer 110 and the first insulating layer 111. The second-2 wiring WLb-2 may be disposed in the same layer as the semiconductor layer ACT of FIG. 7, and may include the same material as that of the semiconductor layer ACT. The second-3 wiring WLb-3 may be disposed on the third insulating layer 113 and covered by the first organic insulating layer OIL1.

Figure 9:
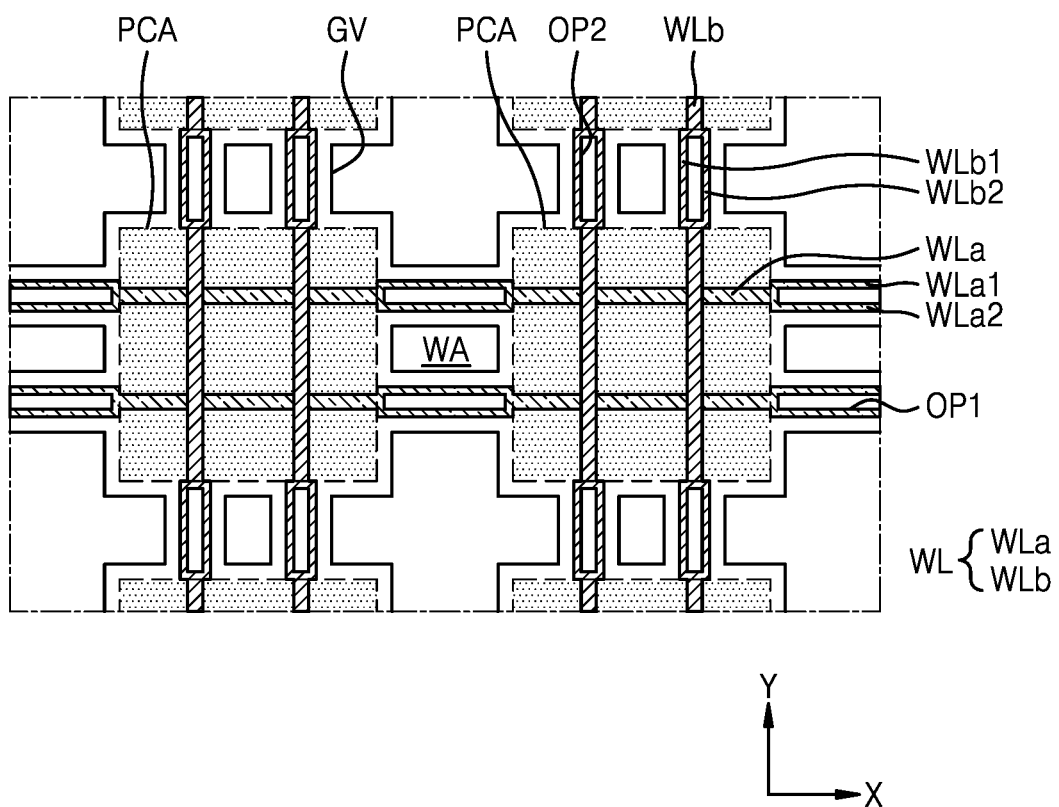
FIG. 9 is a schematic plan view of an embodiment of a pixel circuit area and a wiring area arranged in a display area of a display apparatus.

FIG. 9 is a schematic plan view of an embodiment of a pixel circuit area and a wiring area arranged in a display area of the display apparatus 1. In FIGS. 4, 6, and 9, like reference numerals denote like elements.

Referring to FIG. 9, the pixel circuit areas PCA having the same structure and the wiring area WA by which the pixel circuit areas PCA are spaced apart from each other by a predetermined interval may be arranged in the display area DA of the display apparatus 1.

The pixel circuit areas PCA may be repeatedly arranged in the X direction and the Y direction. Each of the pixel circuit areas PCA may be an area where a pixel circuit for driving a display element and wirings connected to the pixel circuit are arranged. At least one thin film transistor may be arranged in each of the pixel circuit areas PCA.

The wiring area WA, which is an area between the pixel circuit areas PCA, may be an area where the wirings connected to the pixel circuit are extended and arranged. The wiring area WA, in which a plurality of wirings is arranged, may not be an area where components, such as a thin film transistor or a capacitor, constituting the pixel circuit are not arranged.

The wiring area WA may be arranged in the upper, lower, left, and right sides with respect to each of the pixel circuit areas PCA. The first wirings WLa extending in the X direction may be arranged in the left wiring area and the right wiring area, and the second wirings WLb extending in the Y direction may be arranged in the upper wiring area and the lower wiring area. The non-wiring area NWA may be arranged between the wiring areas WA. The non-wiring area NWA may be an area where wirings or transistors are not arranged. The non-wiring area NWA may include a plurality of non-wiring areas, and the non-wiring areas NWA are repeatedly arranged spaced apart from each other in the X direction and the Y direction.

Furthermore, the display apparatus 1 may include an inorganic insulating layer in which a groove GV is defined in the wiring area WA. The inorganic insulating layer may include, as the groove GV is defined, the inorganic insulation pattern IPL formed along edges of the pixel circuit areas PCA and the wiring WL. The groove GV may be defined in the wiring area WA between the pixel circuit areas PCA. In detail, the groove GV may be defined in an area between the wirings WL in the wiring area WA and the non-wiring area NWA.

In an embodiment, each of the wirings WL arranged in the wiring area WA may include a plurality of branched wirings WLa1, WLa2, WLb1, and WLb2 which are branched from each of the wirings WL arranged in the pixel circuit areas PCA.

A first opening OP1 corresponding to the wiring area WA may be defined in the first wiring WLa. The first wiring WLa may be branched by the first opening OP1 into a first-1 branched wiring WLa1 and a first-2 branched wiring WLa2 which are respectively arranged above and below the first opening OP1.

A second opening OP2 corresponding to the wiring area WA may be defined in the second wiring WLb. The second wiring WLb may be branched by the second opening OP2 into a second-1 branched wiring WLb1 and a second-2 branched wiring WLb2 which are respectively arranged to the left and right of the second opening OP2.

As the wirings WL are branched in the wiring area WA into the branched wirings WLa1, WLa2, WLb1, and WLb2, even when a crack is generated in some of the branched wirings WLa1, WLa2, WLb1, and WLb2, a signal may be transmitted via another branched wiring. Accordingly, the reliability of the display apparatus 1 may be improved.

According to embodiments described above, as the widths of wirings in the pixel circuit area and the wiring area are different from each other, the reliability and display quality of a display apparatus may be improved.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
a substrate including:
a plurality of pixel circuit areas; and
a plurality of wiring areas, each of the plurality of wiring areas being arranged between corresponding adjacent pixel circuit areas of the plurality of pixel circuit areas;
a pixel circuit arranged in each of the plurality of pixel circuit areas and including at least one thin film transistor;
a plurality of wirings arranged in the plurality of pixel circuit areas and the plurality of wiring areas; and
a display element connected to the pixel circuit,
wherein a first width of the plurality of wirings arranged in the plurality of wiring areas is greater than a second width of the plurality of wirings arranged in the plurality of pixel circuit areas,
the substrate further includes a plurality of non-wiring areas, each of the plurality of non-wiring areas being arranged between corresponding adjacent wiring areas of the plurality of wiring areas, and
a size of one of the plurality of non-wiring areas is 10 percent or more of a size of one of the plurality of pixel circuit areas.

2. The display apparatus of claim 1, wherein the first width is 1.5 times or more greater than the second width.

3. The display apparatus of claim 1, wherein a size of a pixel electrode of the display element is greater than a size of an area occupied by the pixel circuit.

4. The display apparatus of claim 1, wherein two pixel circuits are provided in each of the plurality of pixel circuit areas.

5. The display apparatus of claim 1, further comprising an inorganic insulating layer in which a groove is defined between the plurality of wirings in a wiring area of the plurality of wiring areas.

6. A display apparatus comprising:
a substrate including:
a plurality of pixel circuit areas; and
a plurality of wiring areas, each of the plurality of wiring areas being arranged between corresponding adjacent pixel circuit areas of the plurality of pixel circuit areas;
a pixel circuit arranged in each of the plurality of pixel circuit areas and including at least one thin film transistor;
a plurality of wirings arranged in the plurality of pixel circuit areas and the plurality of wiring areas; and
a display element connected to the pixel circuit,
wherein a first width of the plurality of wirings arranged in the plurality of wiring areas is greater than a second width of the plurality of wirings arranged in the plurality of pixel circuit areas, wherein the plurality of wirings includes a first wiring extending in a first direction and a second wiring extending in a second direction crossing the first direction,
the first wiring is arranged in a same layer as a gate electrode of the at least one thin film transistor, and
the second wiring is arranged in a different layer from the first wiring.

7. The display apparatus of claim 6, wherein the second wiring is arranged in a same layer as a semiconductor layer of the at least one thin film transistor.

8. The display apparatus of claim 6, wherein the second wiring is arranged on an inter-insulating layer which covers the at least one thin film transistor.

9. The display apparatus of claim 1, further comprising a folding area and a non-folding area,
wherein a size of one of the plurality of pixel circuit areas is identical in the folding area and the non-folding area.

10. A display apparatus comprising:
a substrate including:
a plurality of pixel circuit areas; and
a plurality of wiring areas, each of the plurality of wiring areas being arranged between corresponding adjacent pixel circuit areas of the plurality of pixel circuit areas;
a pixel circuit arranged in the plurality of pixel circuit areas and including at least one thin film transistor;
a plurality of wirings arranged in the plurality of pixel circuit areas and the plurality of wiring areas; and
a display element connected to the pixel circuit,
wherein each of the plurality of wirings arranged in the plurality of wiring areas includes a plurality of branched wirings branched from the plurality of wirings arranged in a pixel circuit area of the plurality of pixel circuit areas, wherein opposite ends of a branched wiring among the plurality of branched wirings respectively extend to wirings next to each other among the plurality of wirings.

11. The display apparatus of claim 10, wherein an opening corresponding to a wiring area of the plurality of wiring areas is defined in the plurality of wirings.

12. The display apparatus of claim 10, wherein the plurality of wirings include a first wiring extending in a first direction and a second wiring extending in a second direction crossing the first direction, and
the first wiring and the second wiring are arranged in different layers.

13. The display apparatus of claim 12, wherein a first opening corresponding to a wiring area of the plurality of wiring areas is defined in the first wiring, and the first wiring is branched into a first-1 branched wiring disposed above the first opening and a first-2 branched wiring disposed below the first opening.

14. The display apparatus of claim 12, wherein a second opening corresponding to a wiring area of the plurality of wiring areas is defined in the second wiring, and
the second wiring is branched into a second-1 branched wiring disposed to left of the second opening and a second-2 branched wiring disposed to right of the second opening.

15. The display apparatus of claim 12, wherein the first wiring includes a scan line, and the second wiring includes a data line.

16. The display apparatus of claim 10, wherein the substrate further includes a plurality of non-wiring areas, each of the plurality of non-wiring areas being arranged between corresponding adjacent wiring areas of the plurality of wiring areas, and
a size of one of the plurality of non-wiring areas is 10 percent or more of a size of one of the plurality of pixel circuit areas.

17. The display apparatus of claim 10, wherein a size of a pixel electrode of the display element is greater than a size of an area occupied by the pixel circuit.

18. The display apparatus of claim 10, further comprising an inorganic insulating layer in which a groove is defined between the plurality of wirings in a wiring area of the plurality of wiring areas.

19. The display apparatus of claim 10, further comprising a folding area and a non-folding area,
wherein a size of one of the plurality of pixel circuit areas is identical in the folding area and the non-folding area.

\* \* \* \* \*